(12) United States Patent
Kang et al.

(10) Patent No.: US 10,024,581 B2
(45) Date of Patent: Jul. 17, 2018

(54) SOLAR POWER GENERATION SYSTEM

(71) Applicant: KOREA INSTITUTE OF ENERGY RESEARCH, Daejeon (KR)

(72) Inventors: Yong Heack Kang, Daejeon (KR); Sang Nam Lee, Daejeon (KR); Jong Kyu Kim, Daejeon (KR); Hyun Jin Lee, Daejeon (KR); Chang Kyun Yu, Daejeon (KR); Hwan Ki Yoon, Daejeon (KR); Kwan Kyo Chai, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 408 days.

(21) Appl. No.: 14/777,524

(22) PCT Filed: Aug. 6, 2013

(86) PCT No.: PCT/KR2013/007099
§ 371 (c)(1),
(2) Date: Sep. 16, 2015

(87) PCT Pub. No.: WO2014/189172
PCT Pub. Date: Nov. 27, 2014

(65) Prior Publication Data
US 2016/0223226 A1 Aug. 4, 2016

(30) Foreign Application Priority Data
May 21, 2013 (KR) .......................... 10-2013-0056813

(51) Int. Cl.
*F28D 15/02* (2006.01)
*F24S 10/70* (2018.01)
(Continued)

(52) U.S. Cl.
CPC .................. *F24S 10/90* (2018.05); *F24J 2/07* (2013.01); *F24J 2/32* (2013.01); *F28D 15/0233* (2013.01);
(Continued)

(58) Field of Classification Search
CPC ...... F24J 2/07; F24J 2/08; F24J 2/1019; F24J 2/12; F24J 2/14; F24J 2/15; F24J 2/32;
(Continued)

(56) References Cited

U.S. PATENT DOCUMENTS 4,049,877 A * 9/1977 Saillant .................... H01G 9/21
427/252
4,257,402 A * 3/1981 Westerman, II ......... F24J 2/055
126/652
(Continued)

FOREIGN PATENT DOCUMENTS

JP 2012-517579 A 8/2012
KR 10-0272319 B1 12/2000
(Continued)

OTHER PUBLICATIONS

International Search Report for PCT/KR2013/007099 dated Feb. 24, 2014 from Korean Intellectual Property Office.

*Primary Examiner* — David J Laux
(74) *Attorney, Agent, or Firm* — Revolution IP, PLLC

(57) ABSTRACT

A solar power generation system according to the present invention comprises a heat pipe arranged so as to come into close contact with an absorption module, for absorbing heat from the absorption module and directly transferring heat to a heat conversion electricity generator, and thereby has the advantages of rendering the system compact by simplifying a heat transfer structure and more effectively transferring heat by increasing contact surface area with the absorption module. Also, ample heat storage space is secured by (Continued)

forming the heat pipe to have a larger volume (heat capacity) than an absorption heat pipe in the absorption module so that an ample heat source can be provided by the heat conversion electricity generator, even during weather conditions when solar radiation can fluctuate suddenly, thereby allowing more stable and efficient operation of the system.

17 Claims, 13 Drawing Sheets

(51) Int. Cl.
    *F24S 10/95*     (2018.01)
    *H01L 35/30*     (2006.01)
    *F24S 10/90*     (2018.01)
    *F24J 2/07*     (2006.01)
    *F24J 2/32*     (2006.01)
    *F24J 2/12*     (2006.01)

(52) U.S. Cl.
    CPC .......... F28D 15/0275 (2013.01); H01L 35/30 (2013.01); *F24J 2/12* (2013.01); *Y02E 10/41* (2013.01); *Y02E 10/44* (2013.01)

(58) Field of Classification Search
    CPC ..... H01L 35/30; F28D 15/02; F28D 15/0233; Y02E 10/41; Y02E 10/42; Y02E 10/44
    See application file for complete search history.

(56) References Cited

U.S. PATENT DOCUMENTS

| | | | | |
|---|---|---|---|---|
| 4,586,334 | A * | 5/1986 | Nilsson, Sr. ............ | F02G 1/043 165/96 |
| 4,785,633 | A * | 11/1988 | Meijer .................... | F02G 1/055 126/635 |
| 5,241,950 | A * | 9/1993 | Mandjuri-Sabet ......... | F24J 2/32 126/589 |
| 5,421,322 | A * | 6/1995 | Karni .................... | B01J 19/122 126/680 |
| 5,465,708 | A * | 11/1995 | Goebel .................... | F03G 6/06 126/635 |
| 6,313,391 | B1 * | 11/2001 | Abbott ..................... | F24J 2/34 136/200 |
| 8,253,008 | B2 * | 8/2012 | Lee ......................... | H01G 9/21 136/200 |
| 2008/0184990 | A1 * | 8/2008 | Tuchelt .................... | F03G 6/06 126/684 |
| 2011/0209476 | A1 | 9/2011 | Chae | |
| 2012/0124999 | A1 | 5/2012 | Gruss et al. | |
| 2015/0357545 | A1 * | 12/2015 | Kang ..................... | H01L 35/30 136/206 |

FOREIGN PATENT DOCUMENTS

| | | |
|---|---|---|
| KR | 10-2010-0008996 A | 1/2010 |
| KR | 10-2010-0025148 A | 3/2010 |
| KR | 10-1008500 B1 | 1/2011 |

* cited by examiner

[Fig.1]
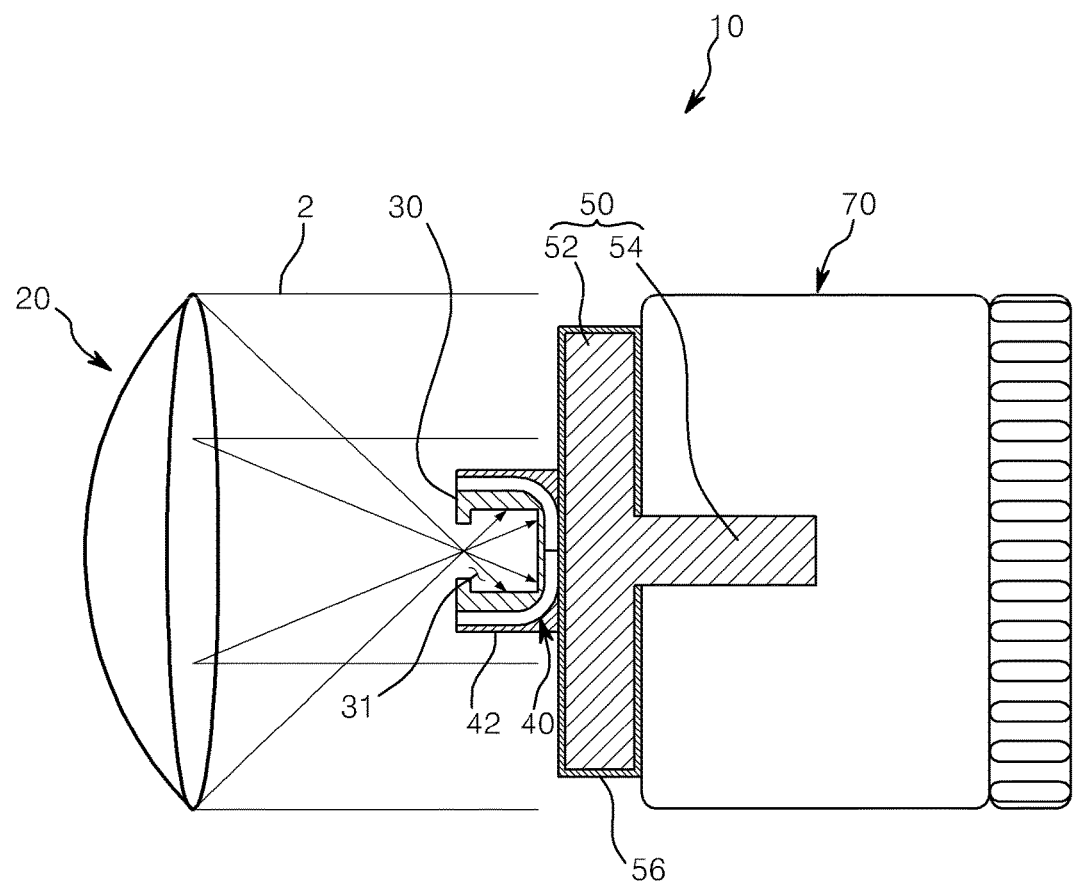

[Fig.2]
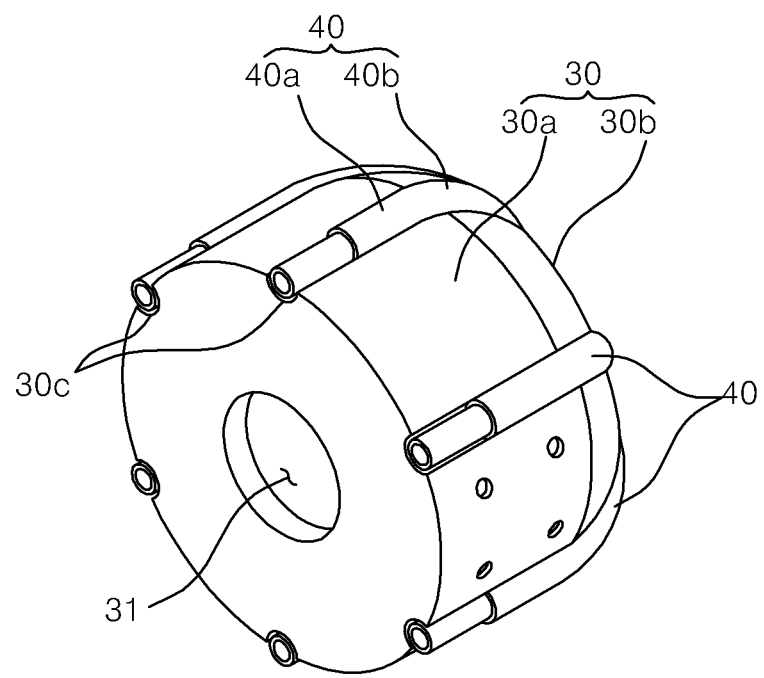

[Fig.3]
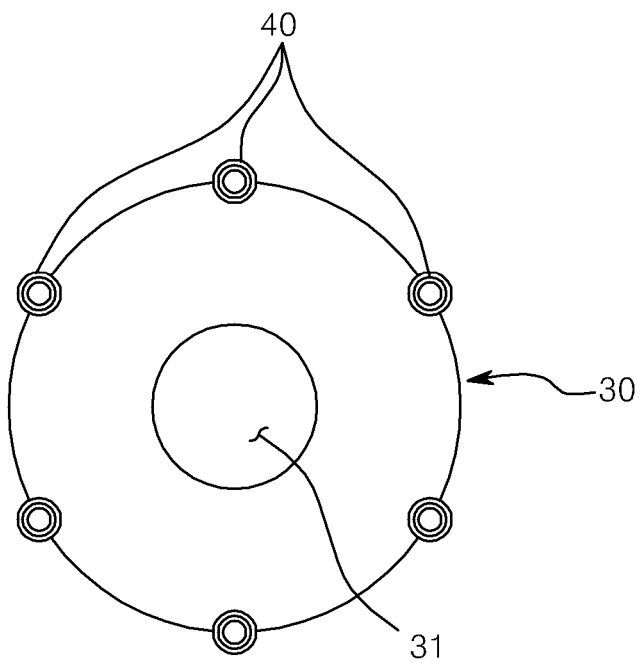

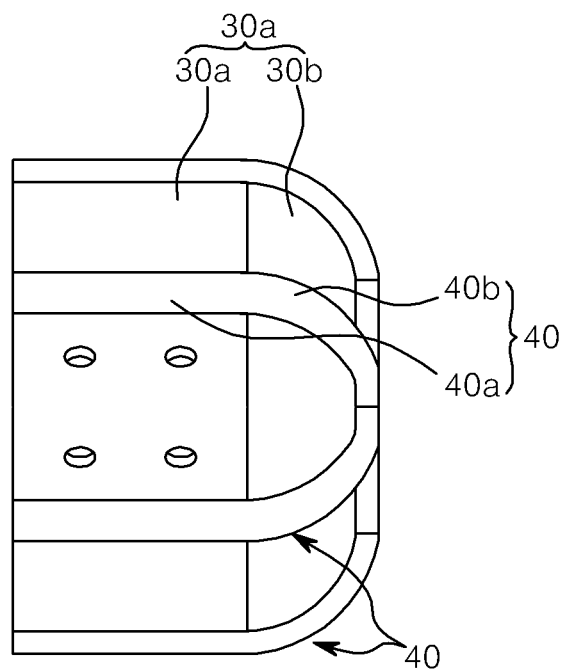
[Fig.4]

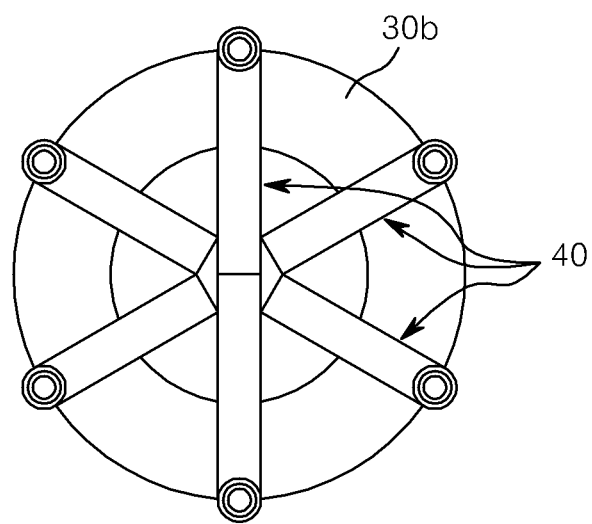
[Fig.5]

[Fig.6]
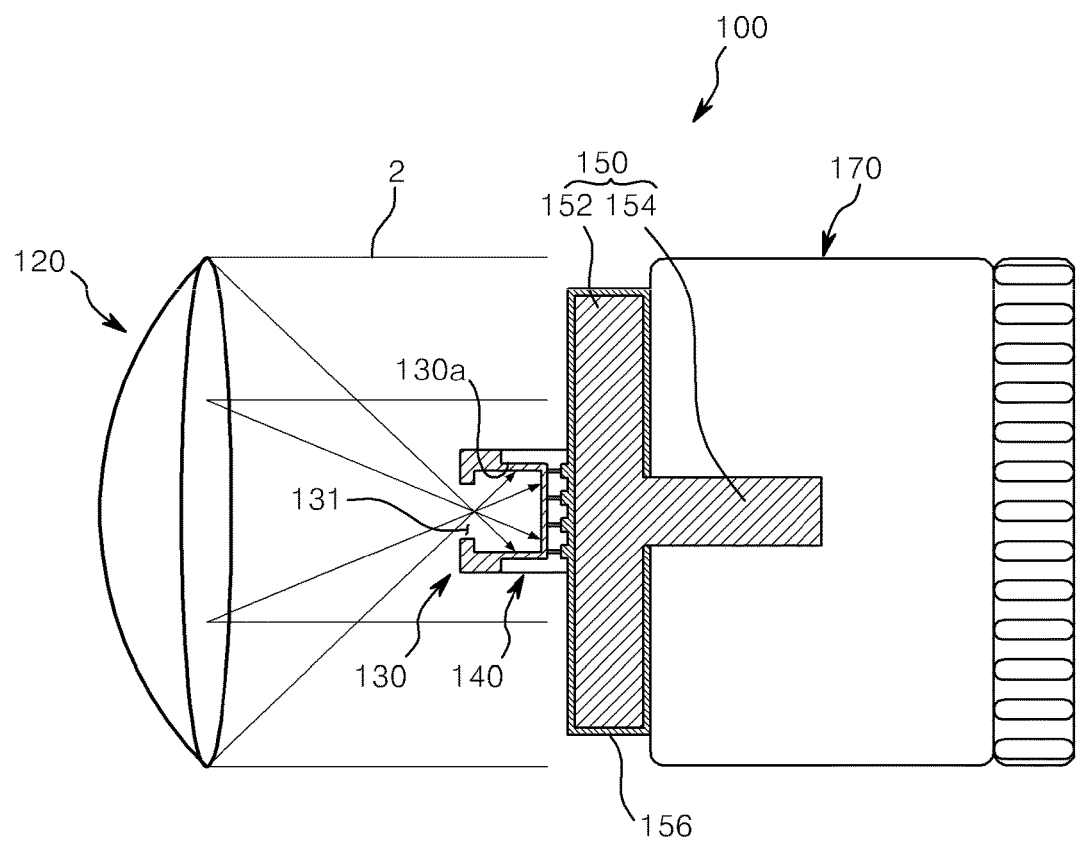

[Fig.7]
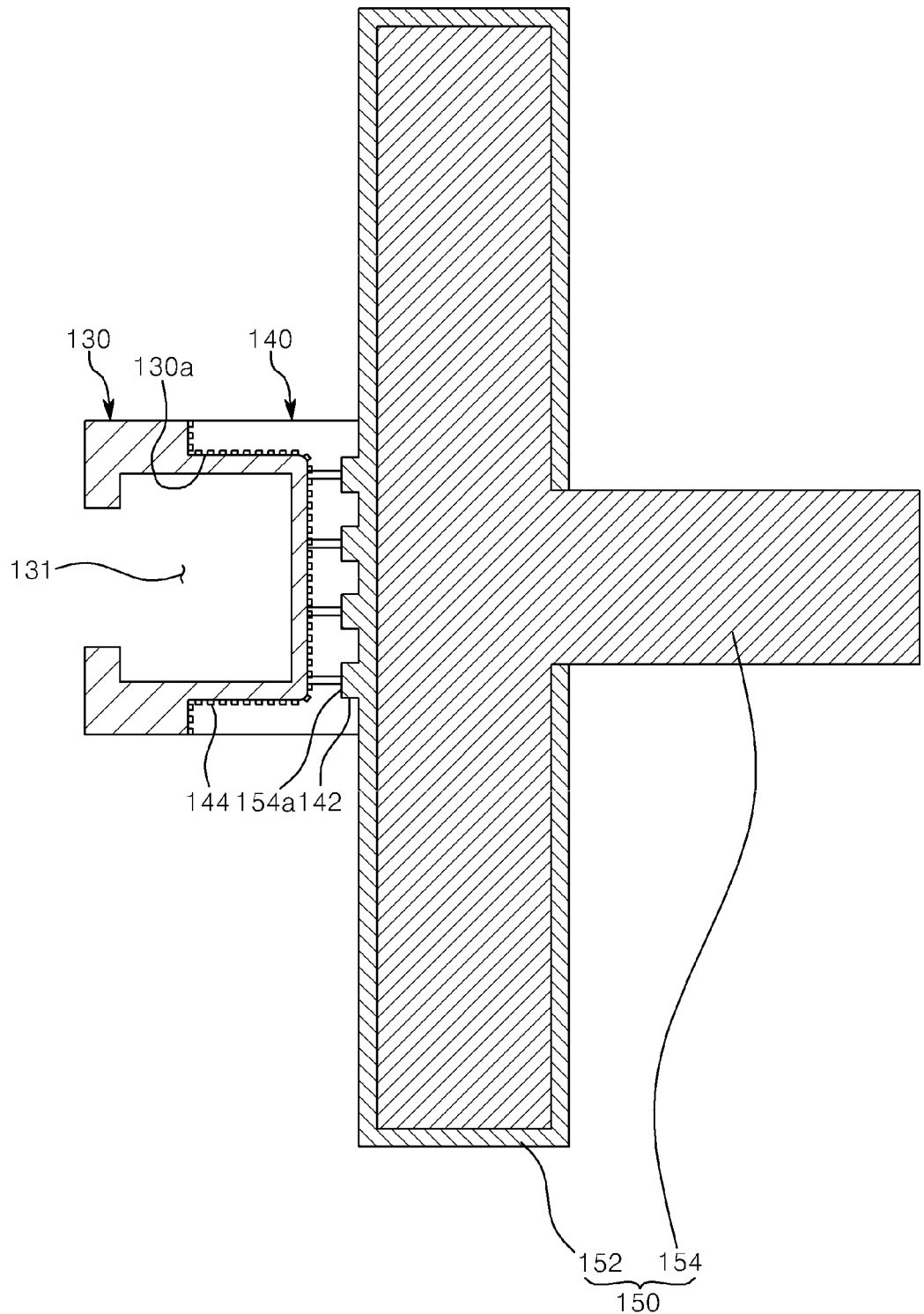

[Fig.8]
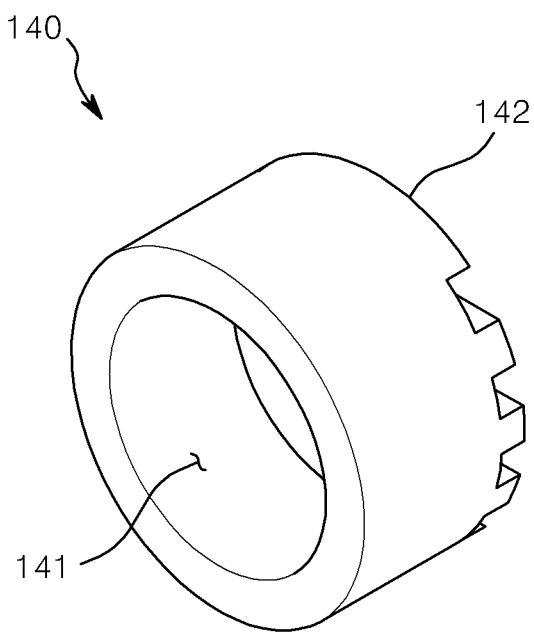

[Fig.9]
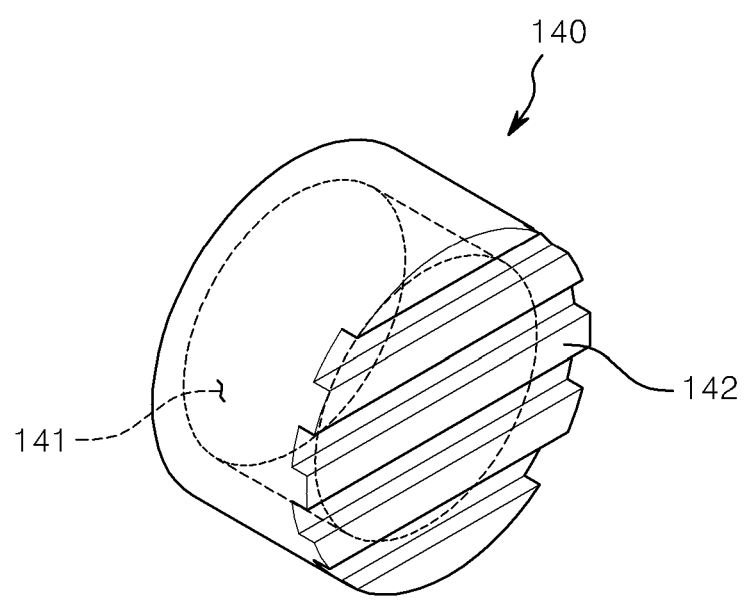

[Fig.10]
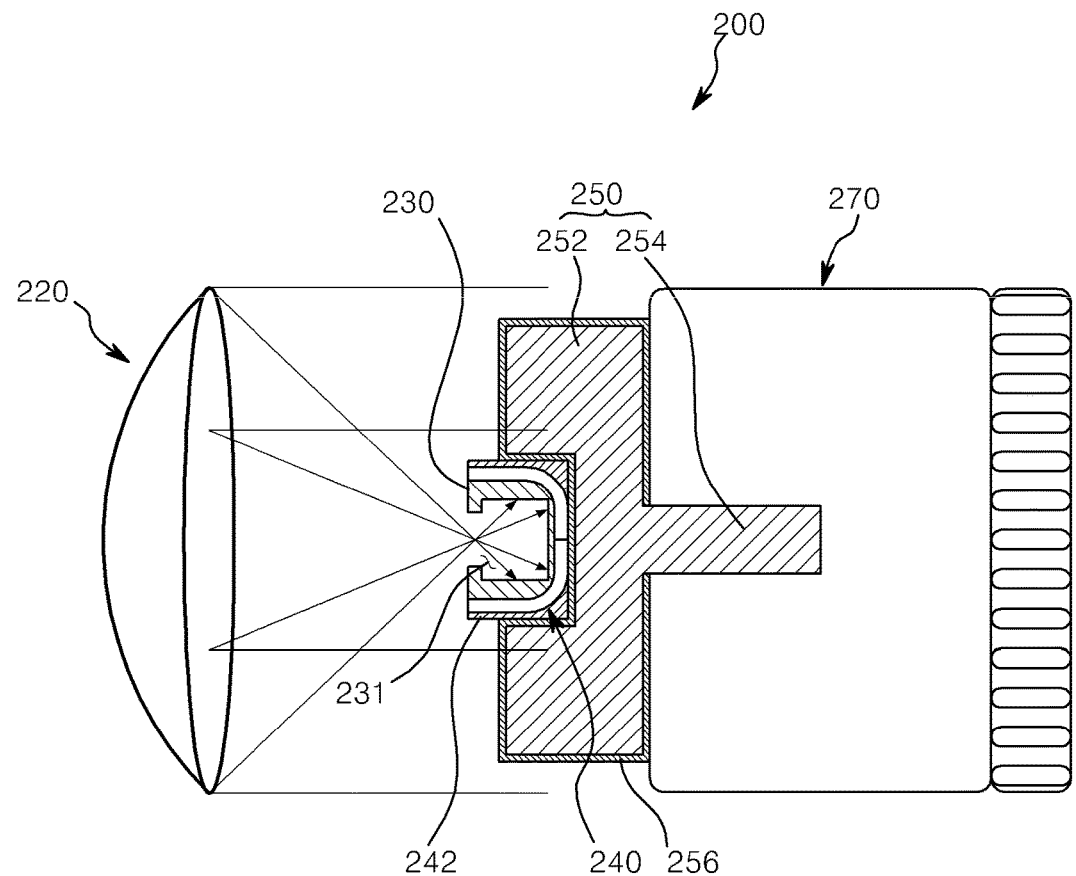

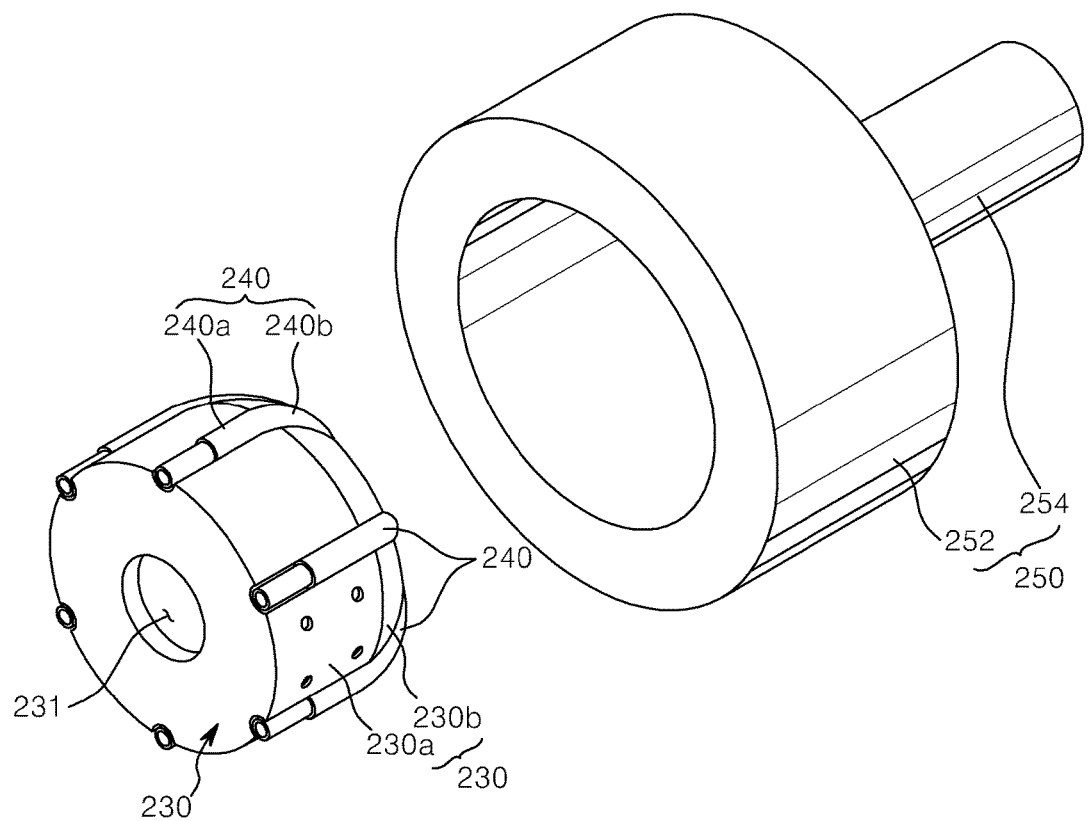
[Fig.11]

[Fig.12]
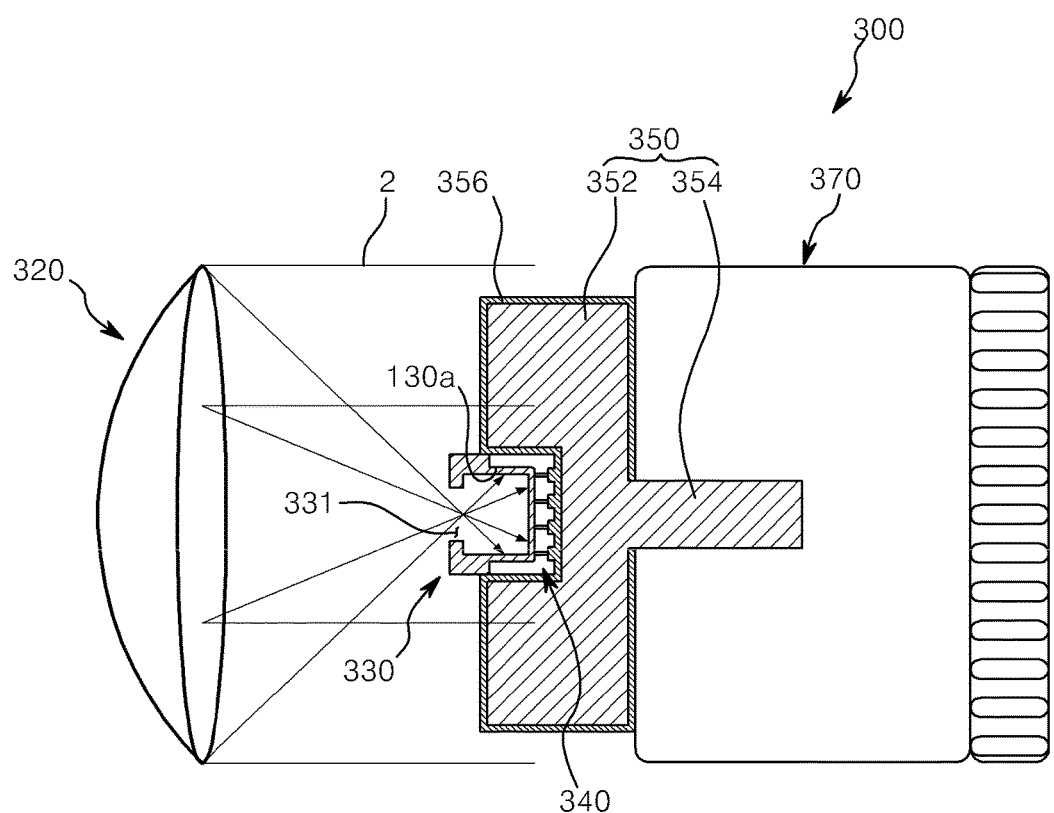

[Fig.13]
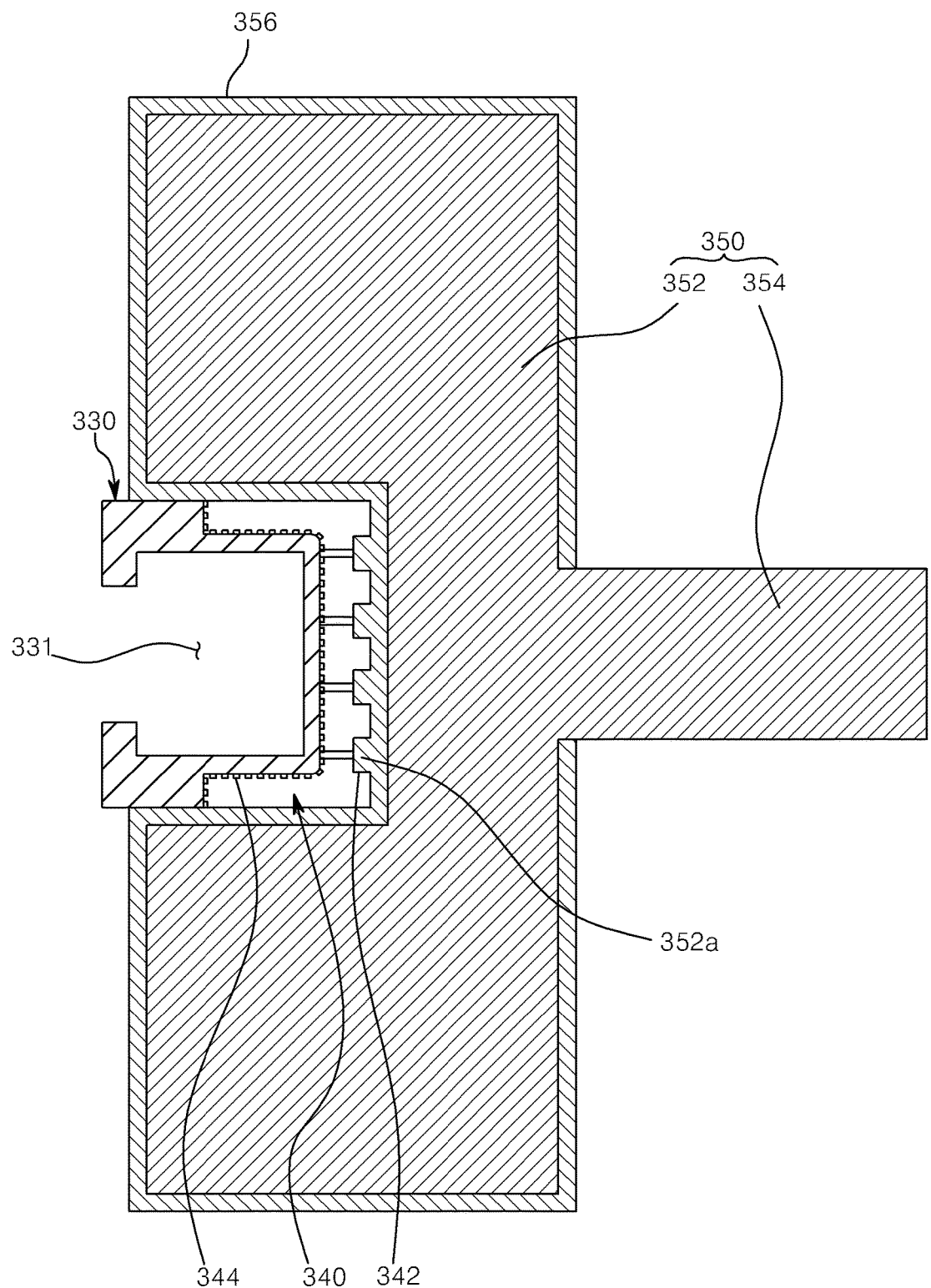

SOLAR POWER GENERATION SYSTEM

CROSS REFERENCE TO PRIOR APPLICATIONS

This application is a National Stage Application of PCT International Patent Application No. PCT/KR2013/007099 filed on Aug. 6, 2013, under 35 U.S.C. § 371, which claims priority to Korean Patent Application No. 10-2013-0056813 filed on May 21, 2013, which are all hereby incorporated by reference in their entirety.

TECHNICAL FIELD

The present invention relates to a solar power generation system, and more particularly, to a solar power generation system that is capable of improving power generation efficiency by transferring thermal energy collected by a dish type solar concentrator to a heat conversion electricity generation device more effectively.

BACKGROUND ART

Due to the problem relating to environmental pollution caused by exhausted chemical energy, such as coal or petroleum, and due to the usage of the chemical energy, concerns and efforts for the development of alternative energy are recently on the rise. Thus, the development of a technology for solar power generation using solar energy that is one of alternative energy is required. Solar power generation is technology for converting thermal energy collected by concentrating solar energy into electric energy. A dish type concentrator is mainly used to collect solar heat onto one place. The solar heat concentrated by the concentrator is absorbed by an absorber and is transferred to a heat conversion electricity generation device, such as an engine, so that electricity can be generated.

Korean Patent Registration No. 10-1008500 discloses a concentrator-fixed type solar thermal high-concentration system.

These days, in order to convert solar energy into electric energy effectively in solar power generation, technology for converting concentrated solar heat into electric energy more effectively with a compact structure needs to be developed.

DETAILED DESCRIPTION OF THE INVENTION

Technical Problem

The present invention provides a solar power generation system that is capable of further improving efficiency by improving heat transfer capability.

Technical Solution

According to an aspect of the present invention, there is provided a solar power generation system including: a concentrator that collects solar heat; an absorption module having a cavity to which solar heat collected by the concentrator is transferred, formed therein; a heat conversion electricity generator that generates electricity by receiving heat absorbed by the absorption module; and a heat pipe that is arranged to come into close contact with the absorption module and the heat conversion electricity generator, that absorbs heat of the absorption module and transfers heat to the heat conversion electricity generator.

According to another aspect of the present invention, there is provided a solar power generation system including: a concentrator that collects solar heat; an absorption module including an absorber having a cavity to which solar heat collected by the concentrator is transferred, a plurality of absorption heat pipes being radially arranged and absorbing heat of the absorber and having a bent pipe shape to surround an outer peripheral surface of the absorber in a longitudinal direction, and a casing formed to surround the absorption heat pipes; an alkali metal thermal to electric converter (AMTEC) that generates electricity by receiving heat absorbed by the absorption module; and a heat pipe including a heating end having a plate shape to come into close contact with a rear side of the casing and absorbing heat of the absorption module and a cooling end that protrudes and extends from the heating end, is inserted into the AMTEC and is cooled.

According to still another aspect of the present invention, there is provided a solar power generation system including: a concentrator that collects solar heat; an absorption module including an absorber having a cavity to which solar heat collected by the concentrator is transferred, and an absorption heat pipe having a cylindrical shape, a front side of which is open so that the absorption heat pipe is mounted on an outer peripheral surface of the absorber; an alkali metal thermal to electric converter (AMTEC) that generates electricity by receiving heat absorbed by the absorption module; and a heat pipe including a heating end having a plate shape to come into close contact with a rear side of the absorption heat pipe, coupled to the rear side of the absorption heat pipe through a block-coupling technique and absorbing heat of the absorption module, and a cooling end that protrudes and extends from the heating end, is inserted into the AMTEC and is cooled.

According to yet still another aspect of the present invention, there is provided a solar power generation system including: a concentrator that collects solar heat; an absorption module including an absorber having a cavity to which solar heat collected by the concentrator is transferred, a plurality of absorption heat pipes being radially arranged and absorbing heat of the absorber and having a bent pipe shape to surround an outer peripheral surface of the absorber in a longitudinal direction, and a casing formed to surround the absorption heat pipes; an alkali metal thermal to electric converter (AMTEC) that generates electricity by receiving heat absorbed by the absorption module; and a heat pipe including a heating end having a cylindrical shape, a front side of which is open so that the heating end is mounted on an outer peripheral surface of the casing, and a cooling end that protrudes and extends from the heating end, is inserted into the AMTEC and is cooled.

According to yet still another aspect of the present invention, there is provided a solar power generation system including: a concentrator that collects solar heat; an absorption module including an absorber having a cavity to which solar heat collected by the concentrator is transferred, and an absorption heat pipe having a cylindrical shape, a front side of which is open so that the absorption heat pipe is mounted on an outer peripheral surface of the absorber; an alkali metal thermal to electric converter (AMTEC) that generates electricity by receiving heat absorbed by the absorption module; and a heat pipe including a heating end having a cylindrical shape, a front side of which is open so that the heating end is mounted on an outer peripheral surface of the absorption heat pipe and the heating end being coupled to a rear side of the absorption heat pipe through a block-coupling technique, and a cooling end that protrudes and extends from the heating end, is inserted into the AMTEC and is cooled.

Effects of the Invention

A solar power generation system according to the present invention includes a heat pipe arranged so as to come into close contact with an absorption module, for absorbing heat from the absorption module and directly transferring heat to a heat conversion electricity generator, and thereby has the advantages of making the system compact by simplifying a heat transfer structure and more effectively transferring heat by increasing a contact surface area with the absorption module.

Also, an ample heat storage space is secured by forming the heat pipe to have a larger volume (heat capacity) than an absorption heat pipe in the absorption module so that an ample heat source can be provided by the heat conversion electricity generator, even during weather conditions when solar radiation can fluctuate suddenly, thereby allowing more stable and efficient operation of the system.

In addition, the heat pipe is mounted on an outer peripheral surface of the absorption heat pipe so that a contact surface area between the absorption heat pipe and the heat pipe is increased, heat transfer can be performed more efficiently, a heat loss can be reduced and heat efficiency can be improved.

Furthermore, the absorption heat pipe and the heat pipe are coupled to each other through a block-coupling technique so that a contact surface area between the absorption heat pipe and the heat pipe are increased and heat transfer can be performed more efficiently.

DESCRIPTION OF THE DRAWINGS

FIG. 1 is a view of a configuration of a solar power generation system according to a first embodiment of the present invention;

FIG. 2 is a perspective view of an absorber having absorption heat pipes illustrated in FIG. 1;

FIG. 3 is a front view of the absorber illustrated in FIG. 2;

FIG. 4 is a side view of the absorber illustrated in FIG. 2;

FIG. 5 is a rear view of the absorber illustrated in FIG. 2;

FIG. 6 is a view schematically illustrating a configuration of a solar power generation system according to a second embodiment of the present invention;

FIG. 7 is a cross-sectional view of an absorber, which illustrates absorption heat pipes illustrated in FIG. 6;

FIG. 8 is a perspective view of the front of the absorption heat pipes illustrated in FIG. 7;

FIG. 9 is a perspective view of the rear of the absorption heat pipes illustrated in FIG. 7;

FIG. 10 is a view schematically illustrating a configuration of a solar power generation system according to a third embodiment of the present invention;

FIG. 11 is a view of a state in which an absorption heat pipe and a heat pipe illustrated in FIG. 10 are coupled to each other;

FIG. 12 is a view schematically illustrating a configuration of a solar power generation system according to a fourth embodiment of the present invention; and FIG. 13 is a cross-sectional view of a state in which an absorption heat pipe and a heat pipe illustrated in FIG. 12 are coupled to each other.

MODE OF THE INVENTION

Hereinafter, a solar power generation system according to embodiments of the present invention will be described in detail with reference to the accompanying drawings.

FIG. 1 is a view of a configuration of a solar power generation system 10 according to a first embodiment of the present invention. FIG. 2 is a perspective view of an absorber having absorption heat pipes illustrated in FIG. 1. FIG. 3 is a front view of the absorber illustrated in FIG. 2. FIG. 4 is a side view of the absorber illustrated in FIG. 2. FIG. 5 is a rear view of the absorber illustrated in FIG. 2.

Referring to FIG. 1, the solar power generation system 10 includes a dish type concentrator 20, an absorption module, a heat pipe 50, and heat conversion electricity generator 70.

The dish type concentrator 20 is also referred to as a parabolic reflector and collects solar heat 2 onto one place. The dish type concentrator 20 is disposed to be on the opposite side of a cavity 31 that will be described below so that the solar heat is collected in the cavity 31 through the dish type concentrator 20. In the current embodiment, a dish type concentrator is used. However, the present invention is not limited thereto, and any type of concentrator that can collect solar heat onto one place can be used.

The absorption module includes an absorber 30, an absorption heat pipe 40, and a casing 42.

The absorber 30 is disposed to be on the opposite side of the dish type concentrator 20. The absorber 30 has a cylindrical shape in which the cavity 31 is formed in a center of the absorber 30. Hereinafter, in the current embodiment, the absorber 30 has a cylindrical shape. The absorber 30 includes a cylindrical portion 30a, a front side of which facing the dish type concentrator 20 is open and which has the cavity 31 formed therein, and a curved surface portion 30b that extends backward from the cylindrical portion 30a and is rounded with a predetermined curvature.

A plurality of seating grooves 30c are formed in an outer peripheral surface of the cylindrical portion 30a so that a plurality of absorption heat pipes 40 that will be described below can be seated in the plurality of seating grooves 30c. The plurality of seating grooves 30c are radially formed to correspond to the plurality of absorption heat pipes 40. The plurality of seating grooves 30c are respectively formed long in a longitudinal direction of the cylindrical portion 30a and then extend up to the curved surface portion 30b.

Referring to FIGS. 2 through 5, the absorption heat pipe 40 is also referred to as a heat-transfer pipe, and an one-side end portion of the absorption heat pipe 40 is a first heating end, and the other-side end portion of the absorption heat pipe 40 is a first cooling end so that the absorption heat pipe 40 transfers heat from the first heating end to the first cooling end. The absorption heat pipe 40 may also be formed in a pipe or chamber form. A working fluid is sealed in the absorption heat pipe 40. Sodium, methanol, acetone, water, or mercury may be used as the working fluid. Vapor heated and evaporated at the first heating end of the absorption heat pipe 40, flows toward the first cooling end and is condensed. A condensate is returned to the first heating end by a capillary force through a wick formed on an inner wall surface of the absorption heat pipe 40. In the current embodiment, the absorption heat pipe 40 has a pipe shape.

The plurality of absorption heat pipes 40 are radially arranged to surround the outer peripheral surface of the absorber 30. The absorption heat pipes 40 surround all of sides and a rear side of the absorber 30 and have a bent pipe shape that is bent along the outer peripheral surface of the absorber 30. That is, each of the plurality of absorption heat pipes 40 includes a rectilinear pipe portion 40a that is disposed long in the longitudinal direction of the cylindrical portion 30a of the absorber 30 and a bent pipe portion 40b that extends from the rectilinear pipe portion 40a and is bent to correspond to the curved surface portion 30b. The rectilinear pipe portion 40a serves as a first heating end heated by heat absorbed by the absorber 30, and the bent pipe portion 40b serves as a first cooling end cooled by transferring heat to a heat pipe 50 that will be described below. Referring to FIG. 5, the bent pipe portions 40b of the absorption heat pipes 40 are disposed to be collected in the center of the curved surface portion 30b that is a rear side of the absorber 30. The bent pipe portions 40b of the absorption heat pipes 40 collected in the center of the curved surface portion 30b transfer heat to the heat pipe 50 that will be described below and thus are cooled.

The casing 42 is disposed to surround an outer peripheral surface of the absorption heat pipe 40.

The heat pipe 50 is also referred to as a heat-transfer pipe, and an one-side end portion of the heat pipe 50 is a second heating end 52, and the other-side end portion of the heat pipe 50 is a second cooling end 54 so that the heat pipe 50 transfers heat from the second heating end 52 to the second cooling end 54. A working fluid is sealed in the heat pipe 50. Sodium, methanol, acetone, water, or mercury may be used as the working fluid. Vapor heated and evaporated at the second heating end 52 of the heat pipe 50, flows toward the second cooling end 54 and is condensed. A condensate is returned to the second heating end 52 by a capillary force through a wick formed on an inner wall surface of the heat pipe 50. The heat pipe 50 is a flat plate type heat pipe. The second heating end 52 of the heat pipe 50 is disposed to come into close contact with the absorption heat pipe 40, and the second cooling end 54 is inserted into the heat conversion electricity generator 70, absorbs heat of the absorption heat pipe 40, and transfers heat to the heat conversion electricity generator 70. The second heating end 52 is disposed to come into close contact with the casing 42 and absorbs heat of the absorption heat pipe 40.

The second heating end 52 has a disc shape to come into close contact with the casing 42. A cross-sectional area of the second heating end 52 is formed to be larger than an area of a rear side of the absorption module, i.e., an area of a rear side of the casing 42 and to be smaller than or equal to an area of a front side of the heat conversion electricity generator 70. That is, the volume of the second heating end 52 is formed to be larger than the volume of the absorption module. Thus, an ample heat storage space is formed so that an ample heat source can be provided by the heat conversion electricity generator 70. Reference numeral 56 represents an outer wall of the second heating end 52.

The second cooling end 54 is configured to have a shape of a pillar that protrudes from the second heating end 52. The second cooling end 54 is inserted into the heat conversion electricity generator 70 and is cooled in the heat conversion electricity generator 70.

An alkali metal thermal to electric converter (AMTEC) is used as the heat conversion electricity generator 70. The AMTEC is a device that directly converts thermal energy into electric energy. In the AMTEC, if there is a temperature difference between both ends of a beta alumina solid electrolyte having ion conductivity, a difference in vapor pressures of liquid sodium filled in cells becomes a driving force so that sodium ions are moved into a gap between loosely-coupled lattice oxygen. The sodium ions that pass through the electrolyte are neutralized on an electrode surface when a condensation process is performed, so that electricity can be generated.

An operation of the solar power generation system 10 having the above configuration according to the first embodiment of the present invention will be described as follows.

The solar heat 2 is collected into the cavity 31 of the absorber 30 using the dish type concentrator 20.

The absorption heat pipes 40 absorb heat of the solar heat 2 collected into the cavity 31. Since the plurality of absorption heat pipes 40 are arranged radially on the outer peripheral surface of the absorber 30, heat can be transferred more effectively from the absorber 30 to the absorption heat pipes 40. Also, since the absorption heat pipes 40 surround the absorber 30, a heat storing effect can be attained by the absorber 30.

The working fluid in the absorption heat pipes 40 is evaporated by absorbing heat from the cavity 31. The evaporated working fluid is moved to the bent pipe portion 40b that serves as a first cooling end.

Heat-exchanging with the heat pipe 50 is performed at the bent pipe portion 40b of the absorption heat pipe 40. The working fluid in the absorption heat pipe 40 is condensed by depriving heat, and the condensed working fluid is again moved to the rectilinear pipe portion 40a that serves as a heating end, through a wick in the absorption heat pipe 40.

The working fluid in the second heating end 52 of the heat pipe 50 is evaporated by absorbing heat from the absorption heat pipe 40. The evaporated working fluid is moved to the second cooling end 54. The working fluid moved to the second cooling end 54 is cooled in the heat conversion electricity generator 70 and is moved to the second heating end 52 again through the wick in the heat pipe 50.

The heat conversion electricity generator 70 generates electricity using heat transferred from the heat pipe 50.

In the above-described solar power generation system 10, the absorption heat pipe 40 is disposed to surround the outer peripheral surface of the absorber 30 so that heat storage can be performed in the absorber 30 and a system can be operated more stably and effectively even in weather conditions in which an amount of solar radiation changes suddenly.

In addition, the heat pipe 50 is arranged between the absorption heat pipe 40 and the heat conversion electricity generator 70 to come into close contact with each other so that a heat transfer structure is further simplified, the system can be made compact, a heat loss is reduced and heat efficiency can be improved.

In addition, the heating end 52 of the heat pipe is formed to have a larger volume than that of the absorption module and to have a cross-sectional area equal to an area of a front side of the heat conversion electricity generator 70 so that an ample heat storage space is secured and an ample heat source can be provided by the heat conversion electricity generator 70. The ample heat storage space is secured so that the system can be operated more stably and effectively even in weather conditions in which an amount of solar radiation changes suddenly.

FIG. 6 is a view schematically illustrating a configuration of a solar power generation system according to a second embodiment of the present invention. FIG. 7 is a cross-sectional view of an absorber, which illustrates absorption heat pipes illustrated in FIG. 6. FIG. 8 is a perspective view of the front of the absorption heat pipes illustrated in FIG. 7. FIG. 9 is a perspective view of the rear of the absorption heat pipes illustrated in FIG. 7.

Referring to FIG. 6, a solar power generation system 100 according to the second embodiment of the present invention is different from the solar power generation system 10 according to the first embodiment in that the solar power generation system 100 includes a dish type concentrator 120, an absorption module, a heat pipe 150 and a heat conversion electricity generator 170 and an absorption heat pipes 140 has a cylindrical shape in which one side of the absorption heat pipe 140 is open, so that the absorption heat pipe 140 is mounted on an outer peripheral surface of the absorber 130. The difference will now be described in detail.

The absorption module includes the absorber 130 and the absorption heat pipe 140.

The absorber 130 is disposed to be on the opposite side of the dish type concentrator 120 and has a cylindrical shape in which a front side of the absorber 130 is open and a cavity 131 is formed in a center of the absorber 130. Hereinafter, in the current embodiment, the absorber 130 has a cylindrical shape. A stepped portion 130a is formed in at least a part of the outer peripheral surface of the absorber 130 so that the absorption heat pipe 140 is mounted on an outer peripheral surface of the absorber 130.

Referring to FIGS. 7 through 9, the absorption heat pipe 140 has a cylindrical shape in which the front side of the absorption heat pipe 140 is open so that the absorption heat pipe 140 is mounted on an outer peripheral surface of the absorber 130. The absorption heat pipe 140 has a shape corresponding to the absorber 130. In the current embodiment, the absorber 130 has a cylindrical shape. Thus, the absorption heat pipe 140 also has a cylindrical shape.

The absorption heat pipe 140 is also referred to as a heat-transfer pipe, and an one-side end portion of the absorption heat pipe 140 is a first heating end, and the other-side end portion of the absorption heat pipe 140 is a first cooling end so that the absorption heat pipe 140 transfers heat from the first heating end to the first cooling end. A working fluid is sealed in the absorption heat pipe 140. Methanol, acetone, water, or mercury may be used as the working fluid. Vapor heated at the first heating end of the absorption heat pipe 140 and evaporated, flows toward the first cooling end and is condensed. A condensate is returned to the heating end by a capillary force through a wick 144 formed on an inner wall surface of the absorption heat pipe 140.

The front of the absorption heat pipe 140 is mounted on an outer peripheral surface of the absorber 130, and the rear of the absorption heat pipe 140 is coupled to the heat pipe 150. That is, an outer circumferential surface of the absorption heat pipe 140 is mounted on the outer peripheral surface of the absorber 130 and serves as a first heating end heated by heat of the absorber 130, and a rear side of the absorption heat pipe 140 serves as a first cooling end cooled by depriving heat from the heat pipe 150.

A coupling portion 141 is formed in the front of the absorption heat pipe 140, is mounted on an outer peripheral surface of the stepped portion 130a and is coupled to the stepped portion 130a.

A first uneven portion 142 is formed on the rear side of the absorption heat pipe 140. The first uneven portion 142 of the absorption heat pipe 140 is coupled to the heat pipe 150 that will be described below through a block-coupling technique. The absorption heat pipe 140 and the heat pipe 150 are coupled to each other through the block-coupling technique so that a heat transfer area between the absorption heat pipe 140 and the heat pipe 150 is increased and heat transfer efficiency can be improved.

The heat pipe 150 is also referred to as a heat-transfer pipe, and an one-side end portion of the heat pipe 150 is a second heating end 152, and the other-side end portion of the heat pipe 150 is a second cooling end 154 so that the heat pipe 150 transfers heat from the second heating end 152 to the second cooling end 154. A working fluid is sealed in the heat pipe 150. Sodium, methanol, acetone, water, or mercury may be used as the working fluid. Vapor heated and evaporated at the second heating end 152 of the heat pipe 150, flows toward the second cooling end 154 and is condensed. A condensate is returned to the second heating end 152 by a capillary force through a wick formed on an inner wall surface of the heat pipe 150. The heat pipe 150 is a flat plate type heat pipe.

The second heating end 152 of the heat pipe 150 is disposed to come into close contact with the absorption heat pipe 140, and the second cooling end 154 is inserted into the heat conversion electricity generator 170, absorbs heat of the absorption heat pipe 140, and transfers heat to the heat conversion electricity generator 170. The second heating end 152 is disposed to come into close contact with a rear side of the absorption heat pipe 140 and absorbs heat of the absorption heat pipe 140.

The second heating end 152 has a disc shape to come into close contact with the rear side of the absorption heat pipe 140. A cross-sectional area of the second heating end 152 is formed to be larger than an area of a rear side of the absorption module, i.e., an area of a rear side of the absorption heat pipe 140 and to be smaller than or equal to an area of a front side of the heat conversion electricity generator 170. That is, the volume of the second heating end 152 is formed to be larger than the volume (heat capacity) of the absorption module. Thus, an ample heat storage space is formed so that an ample heat source can be provided by the heat conversion electricity generator 170. Reference numeral 156 represents an outer wall of the second heating end 152.

The second cooling end 154 is configured to have a shape of a pillar that protrudes from the second heating end 152. The second cooling end 154 is inserted into the heat conversion electricity generator 170 and is cooled in the heat conversion electricity generator 170.

A second uneven portion 154a is formed on a side of the second casing 156 corresponding to the absorption heat pipe 140. The absorption heat pipe 140 and the heat pipe 150 are coupled to each other in a forward/backward direction, and the first uneven portion 142 of the absorption heat pipe 140 and the second uneven portion 154a of the heat pipe 150 are coupled to each other through a block-coupling technique.

AMTEC is used as the heat conversion electricity generator 170. The AMTEC is a device that directly converts thermal energy into electric energy. In the AMTEC, if there is a temperature difference between both ends of a beta alumina solid electrolyte having ion conductivity, a difference in vapor pressures of liquid sodium filled in cells becomes a driving force so that sodium ions are moved into a gap between loosely-coupled lattice oxygen. The sodium ions that pass through the electrolyte are neutralized on an electrode surface when a condensation process is performed, so that electricity can be generated.

In the solar power generation system 100 having the above configuration according to the second embodiment of the present invention, the absorption heat pipe 140 are mounted on the outer peripheral surface of the absorber 130 and are coupled to the absorber 130 so that a contact surface area between the absorber 130 and the absorption heat pipe 140 is increased and heat transfer can be performed more efficiently.

In addition, since the absorption heat pipe 140 and the heat pipe 150 are coupled to each other through the block-coupling technique, the contact surface area between the absorption heat pipe 140 and the heat pipe 150 is increased so that heat transfer can be performed more effectively.

In addition, the heating end 152 of the heat pipe is formed to have a larger volume than that of the absorption module and to have a cross-sectional area equal to an area of a front side of the heat conversion electricity generator 170 so that an ample heat storage space is secured and an ample heat source can be provided by the heat conversion electricity generator 170. The ample heat storage space is secured so that the system can be operated more stably and effectively even in weather conditions in which an amount of solar radiation changes suddenly.

FIG. 10 is a view schematically illustrating a configuration of a solar power generation system according to a third embodiment of the present invention. FIG. 11 is a view of a state in which an absorption heat pipe and a heat pipe illustrated in FIG. 10 are coupled to each other.

Referring to FIG. 10, a solar power generation system 200 according to the third embodiment of the present invention is different from the solar power generation system 10 according to the first embodiment in that the solar power generation system 200 includes a dish type concentrator 220, an absorption module, a heat pipe 250 and a heat conversion electricity generator 270 and the heat pipe 250 has a cylindrical shape in which one side of the heat pipe 250 is open, so that the heat pipe 250 is mounted on an outer peripheral surface of the absorption heat pipe 240. The difference will now be described in detail.

The absorption module includes the absorber 230, the absorption heat pipe 240, and a casing 242.

The absorber 230 is disposed to be on the opposite side of the dish type concentrator 220. The absorber 230 has a cylindrical shape in which a cavity 231 is formed in a center of the absorber 230. Hereinafter, in the current embodiment, the absorber 230 has a cylindrical shape. The absorber 230 includes a cylindrical portion 230a, a front side of which facing the dish type concentrator 220 is open and which has the cavity 231 formed therein, and a curved surface portion 230b that extends backward from the cylindrical portion 230a and is rounded with a predetermined curvature.

Each of the absorption heat pipe 240 and the heat pipe 250 is also referred to as a heat-transfer pipe, and an one-side end portion of the absorption heat pipe 240 and the heat pipe 250 is a heating end, and the other-side end portion of the absorption heat pipe 240 and the heat pipe 250 is a cooling end so that the absorption heat pipe 240 and the heat pipe 250 transfer heat from the heating end to the cooling end. A working fluid is sealed in each of the absorption heat pipe 240 and the heat pipe 250. Methanol, acetone, water, or mercury may be used as the working fluid. In the current embodiment, the absorption heat pipe 240 has a pipe shape.

The plurality of absorption heat pipes 240 are radially arranged to surround the outer peripheral surface of the absorber 230. The absorption heat pipe 240 surrounds all of sides and a rear side of the absorber 230 and have a bent pipe shape that is bent along the outer peripheral surface of the absorber 230. That is, each of the plurality of absorption heat pipes 240 includes a rectilinear pipe portion 240a that is disposed long in the longitudinal direction of the cylindrical portion 230a of the absorber 230 and a bent pipe portion 240b that extends from the rectilinear pipe portion 240a and is bent to correspond to the curved surface portion 230b. The rectilinear pipe portion 240a serves as a first heating end heated by heat absorbed by the absorber 230, and the bent pipe portion 240b serves as a second cooling end cooled by transferring heat to a heat pipe 250 that will be described below. Referring to FIG. 10, the bent pipe portions 240b of the absorption heat pipes 240 are disposed to be collected in the center of the curved surface portion 230b that is a rear side of the absorber 230. The bent pipe portions 240b of the absorption heat pipes 240 collected in the center of the curved surface portion 230b transfer heat to the heat pipes 252 that will be described below and thus are cooled.

The casing 242 is disposed to surround an outer side of the absorption heat pipe 240.

The heat pipe 250 is also referred to as a heat-transfer pipe, and an one-side end portion of the heat pipes 250 is a second heating end 252, and the other-side end portion of the heat pipe 250 is a second cooling end 254 so that the heat pipe 250 transfers heat from the second heating end 252 to the second cooling end 254. A working fluid is sealed in the heat pipe 250. Sodium, methanol, acetone, water, or mercury may be used as the working fluid. Vapor heated and evaporated at the second heating end 252 of the heat pipe 250, flows toward the second cooling end 254 and is condensed. A condensate is returned to the second heating end 252 by a capillary force through a wick formed on an inner wall surface of the heat pipe 250.

The heat pipe 250 is a heat storage type heat pipe. Any type of the heat pipe 250 that may absorb and store heat of the sides of the absorption module may be used. In the current embodiment, the heat pipe 250 has a cylindrical shape.

The heat pipe 250 includes the second heating end 252 having a cylindrical shape, a front side of which is open so that the heat pipe 250 is mounted on the outer peripheral surface of the absorption module, and the second cooling end 254 that protrudes and extends from the second heating end 252, is inserted into the heat conversion electricity generator 270 and is cooled in the heat conversion electricity generator 270. Reference numeral 256 represents an outer wall of the second heating end 252.

The second heating end 252 is formed to have a cylindrical shape to surround sides and a rear side of the casing 242. A rear side of the second heating end 252 is formed to be larger than the rear side of the casing 242 and to be smaller than or equal to a front side of the heat conversion electricity generator 270. That is, the volume of the second heating end 252 is formed to be larger than the volume of the absorption module so that an ample heat storage space is formed and an ample heat source can be provided by the heat conversion electricity generator 270.

The second cooling end 254 has a shape of a pillar that protrudes from the rear side of the second heating end 252 backward.

An AMTEC is used as the heat conversion electricity generator 270. The AMTEC is a device that directly converts thermal energy into electric energy. In the AMTEC, if there is a temperature difference between both ends of a beta alumina solid electrolyte having ion conductivity, a difference in vapor pressures of liquid sodium filled in cells becomes a driving force so that sodium ions are moved into a gap between loosely-coupled lattice oxygen. The sodium ions that pass through the electrolyte are neutralized on an electrode surface when a condensation process is performed, so that electricity can be generated.

In the solar power generation system 3000 having the above configuration according to the third embodiment of the present invention, the absorption heat pipes 240 are radially arranged to surround the outer peripheral surface of the absorber 230 so that heat storage can be performed in the absorber 230 and a system can be operated more stably and effectively even in weather conditions in which an amount of solar radiation changes suddenly. In addition, heat transfer from the absorber 230 can be more effectively performed.

In addition, since the heat pipe 250 is arranged between the absorption heat pipe 240 and the heat conversion electricity generator 270 to come into close contact with each other so that a heat transfer structure is further simplified, the system can be made compact, a heat loss is reduced and heat efficiency can be improved.

In addition, the heat pipe 250 is disposed to be mounted on the outer peripheral surfaces of the absorption heat pipes 240 so that heat transfer between the absorption heat pipes 240 and the heat pipe 250 can be more effectively performed and heat efficiency can be improved. In addition, since the absorption heat pipes 240 are surrounded by the heat pipe 250, a heat loss of the absorption heat pipes 240 can be reduced.

In addition, the heat pipe 250 is formed to surround all of sides and a rear side of the casing 242 and to have a larger volume than that of the absorption module so that an ample heat storage space is secured and an ample heat source can be provided by the heat conversion electricity generator 270. In addition, the ample heat storage space is secured so that the system can be operated more stably and effectively even in weather conditions in which an amount of solar radiation changes suddenly.

FIG. 12 is a view schematically illustrating a configuration of a solar power generation system according to a fourth embodiment of the present invention. FIG. 13 is a cross-sectional view of a state in which an absorption heat pipe and a heat pipe illustrated in FIG. 12 are coupled to each other.

Referring to FIGS. 12 and 13, a solar power generation system 300 according to the fourth embodiment of the present invention is different from the solar power generation system 200 according to the third embodiment in that the solar power generation system 300 includes a dish type concentrator 320, an absorption module, a heat pipe 350 and a heat conversion electricity generator 370 and all of an absorption heat pipe 340 and the heat pipe 350 have a cylindrical shape in which a front side of the absorption heat pipe 340 and the heat pipe 350 is open. The difference will now be described in detail.

The absorption module includes an absorber 330 and the absorption heat pipe 340.

The absorber 330 is disposed to be on the opposite side of the dish type concentrator 320 and has a cylindrical shape, a front side of which is open and in which a cavity 331 is formed in a center of the absorber 330. Hereinafter, in the current embodiment, the absorber 330 has a cylindrical shape. A stepped portion is formed in at least a part of the outer peripheral surface of the absorber 330 so that the absorption heat pipe 340 is mounted on an outer peripheral surface of the absorber 330.

Each of the absorption heat pipe 340 and the heat pipe 350 is also referred to as a heat-transfer pipe, and an one-side end portion of the absorption heat pipe 340 and the heat pipe 350 is a heating end, and the other-side end portion of the absorption heat pipe 340 and the heat pipe 350 is a cooling end so that the absorption heat pipe 340 and the heat pipe 350 transfer heat from the heating end to the cooling end. A working fluid is sealed in each of the absorption heat pipe 340 and the heat pipe 350. Methanol, acetone, water, or mercury may be used as the working fluid.

The absorption heat pipe 340 has a cylindrical shape, a front side of which is open so that the absorption heat pipe 340 can be mounted on the outer peripheral surface of the absorber 330. The absorption heat pipe 340 has a shape corresponding to the absorber 330. In the current embodiment, the absorber 330 has a cylindrical shape. Thus, the absorption heat pipe 340 also has a cylindrical shape.

The front of the absorption heat pipes 340 is mounted on an outer peripheral surface of the absorber 330, and the rear of the absorption heat pipe 340 is coupled to the heat pipe 350. That is, an outer circumferential surface of absorption heat pipe 340 is mounted on the outer peripheral surface of the absorber 330 and serves as a first heating end heated by heat of the absorber 330, and a rear side of the absorption heat pipe 340 serves as a first cooling end cooled by depriving heat from the heat pipe 350. A wick 144 is formed on an inner wall surface of the absorption heat pipe 340 to guide the working fluid condensed at the first cooling end to be returned to the first heating end.

A first uneven portion 342 is formed on the rear side of the absorption heat pipe 340. The first uneven portion 342 of the absorption heat pipe 340 is coupled to the heat pipe 350 that will be described below through a block-coupling technique. The absorption heat pipe 340 and the heat pipe 350 are coupled to each other through the block-coupling technique so that a heat exchange area is increased and heat exchange efficiency can be improved.

The heat pipe 350 is also referred to as a heat-transfer pipe, and an one-side end portion of the heat pipe 350 is a second heating end 352, and the other-side end portion of the heat pipe 350 is a second cooling end 354 so that the heat pipe 350 transfers heat from the second heating end 352 to the second cooling end 354. The working fluid is sealed in the heat pipe 350. Sodium, methanol, acetone, water, or mercury may be used as the working fluid. Vapor heated and evaporated at the second heating end 352 of the heat pipe 350, flows toward the second cooling end 354 and is condensed. A condensate is returned to the second heating end 352 by a capillary force through the wick formed on the inner wall surface of the heat pipe 350.

The heat pipe 350 is a heat storage type heat pipe. Any type of the heat pipe 350 that may absorb and store heat of the sides of the absorption module may be used. In the current embodiment, the heat pipe 350 has a cylindrical shape.

The heat pipes 350 includes the second heating end 352 having a cylindrical shape, a front side of which is open so that the heat pipe 350 is mounted on the outer peripheral surface of the absorption heat pipe 340, and the second cooling end 354 that protrudes and extends from the second heating end 352, is inserted into the heat conversion electricity generator 370 and is cooled in the heat conversion electricity generator 370. Reference numeral 356 represents an outer wall of the second heating end 352.

The second heating end 352 is formed to have a cylindrical shape to surround sides of the absorber 330 and sides and a rear side of the absorption heat pipe 340. A rear side of the second heating end 352 is formed to be larger than the rear side of the absorption heat pipe 340 and to be smaller than or equal to a front side of the heat conversion electricity generator 370. That is, the volume of the second heating end 352 is formed to be larger than the volume of the absorption module so that an ample heat storage space is formed and an ample heat source can be provided by the heat conversion electricity generator 370.

The second cooling end 354 has a shape of a pillar that protrudes from the rear side of the second heating end 352 backward.

The absorption heat pipe 340 and the heat pipe 350 are coupled to each other in a forward/backward direction, and a second uneven portion 352a is formed on the second heating end 352 to correspond to the first uneven portion 342 of the absorption heat pipe 340. Thus, the absorption heat pipe 340 and the heat pipe 350 are coupled to each other through a block-coupling technique.

An AMTEC is used as the heat conversion electricity generator 370.

In the solar power generation system 300 having the above configuration according to the fourth embodiment of the present invention, the absorption heat pipe 340 is mounted on the outer peripheral surface of the absorber 330 and are coupled to each other so that a contact surface area between the absorber 330 and the absorption heat pipe 340 is increased and heat transfer can be more effectively performed.

In addition, since the heat pipe 350 is mounted on the outer peripheral surface of the absorption heat pipe 340 and is coupled thereto, a contact surface area between the absorption heat pipe 340 and the heat pipe 350 is increased so that heat transfer can be more effectively performed, a heat loss of the absorption heat pipe 340 is reduced and heat efficiency can be improved.

In addition, since the absorption heat pipe 340 and the heat pipe 350 are coupled to each other through a block-coupling technique, the contact surface area is further increased and heat transfer can be more effectively performed.

In addition, the heat pipe 350 is formed to surround all of sides and a rear side of the absorption heat pipe 340 and to have a larger volume than that of the absorption module so that an ample heat storage space is secured and an ample heat source can be provided by the heat conversion electricity generator 370. In addition, the ample heat storage space is secured so that the system can be operated more stably and effectively even in weather conditions in which an amount of solar radiation changes suddenly.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

According to the present invention, a solar power generation system that is capable of improving power generation efficiency by performing heat transfer more effectively can be manufactured.

The invention claimed is:

1. A solar power generation system comprising:
a concentrator that collects solar heat;
an absorption module comprising an absorber, a front side of which is open and has a cavity formed therein absorbing heat from solar heat from the concentrator, and an absorption heat pipe being disposed to surround the absorber and absorbing heat of the absorber;
an alkali metal thermal to electric converter (AMTEC) that generates electricity by receiving heat absorbed by the absorption module; and
a heat pipe that is arranged to directly contact with a rear side of the absorption heat pipe of the absorption module and the AMTEC, that absorbs heat of the absorption module and transfers heat to the AMTEC.

2. The solar power generation system of claim 1, wherein the heat pipe comprises:
a heating end that is disposed to come into close contact with a rear side of the absorption module and absorbs heat of the absorption heat pipe;
a cooling end that protrudes and extends from the heating end, is inserted into the AMTEC and is cooled in the AMTEC.

3. The solar power generation system of claim 2, wherein a cross-sectional area of the heating end is formed to be larger than an area of the rear side of the absorption module and to be smaller than or equal to an area of a front side of the AMTEC.

4. The solar power generation system of claim 2, wherein the heating end has a shape of a plate in which a front side of the heating end faces the rear side of the absorption module and a rear side of the heating end faces a front side of the AMTEC, and the cooling end has a shape of a pillar that protrudes from the rear side of the heating end backward.

5. The solar power generation system of claim 2, wherein a volume of the heating end is formed to be larger than a volume of the absorption module.

6. The solar power generation system of claim 2, wherein the absorption module further comprises a casing formed to surround the absorption heat pipe.

7. The solar power generation system of claim 1, wherein the heat pipe comprises:
a heating end having a cylindrical shape, a front side of which is open so that the heating end is mounted on an outer peripheral surface of the absorption module, the heating end absorbing heat of the absorption module; and
a cooling end that extends from the heating end, is inserted into the AMTEC and is cooled in the AMTEC.

8. The solar power generation system of claim 7, wherein the heating end is formed to have the cylindrical shape to surround sides and the rear side of the absorption module, and the cooling end has a shape of a pillar that protrudes from a rear side of the heating end backward.

9. The solar power generation system of claim 7, wherein the rear side of the heating end is formed to be larger than the rear side of the absorption module and to be smaller than or equal to the front side of the AMTEC.

10. The solar power generation system of claim 1, wherein the absorption heat pipe is radially arranged to surround an outer peripheral surface of the absorber in a longitudinal direction.

11. The solar power generation system of claim 1, wherein the absorption heat pipe has a cylindrical shape, a front side of which is open so that the absorption heat pipe is mounted on an outer peripheral surface of the absorber.

12. The solar power generation system of claim 11, wherein the heat pipe is coupled to the rear side of the absorption heat pipe through a block-coupling technique.

13. The solar power generation system of claim 1, wherein the concentrator is of a dish type.

14. A solar power generation system comprising:
a concentrator that collects solar heat;
an absorption module comprising an absorber having a cavity to which solar heat collected by the concentrator is transferred, a plurality of absorption heat pipes being radially arranged and absorbing heat of the absorber and having a bent pipe shape to surround an outer peripheral surface of the absorber in a longitudinal direction, and a casing formed to surround the absorption heat pipes;

an alkali metal thermal to electric converter (AMTEC) that generates electricity by receiving heat absorbed by the absorption module; and a heat pipe comprising a heating end having a plate shape to come into directly contact with a rear side of the casing and the plurality of absorption heat pipes and absorbing heat of the absorption module, and a cooling end that protrudes and extends from the heating end, is inserted into the AMTEC and is cooled.

15. A solar power generation system comprising:

a concentrator that collects solar heat;

an absorption module comprising an absorber having a cavity to which solar heat collected by the concentrator is transferred, and an absorption heat pipe having a cylindrical shape, a front side of which is open so that the absorption heat pipe is mounted on an outer peripheral surface of the absorber;

an alkali metal thermal to electric converter (AMTEC) that generates electricity by receiving heat absorbed by the absorption module; and a heat pipe comprising a heating end having a plate shape to come into close contact with a rear side of the absorption heat pipe, coupled to the rear side of the absorption heat pipe through a block-coupling technique and absorbing heat of the absorption module, and a cooling end that protrudes and extends from the heating end, is inserted into the AMTEC and is cooled.

16. A solar power generation system comprising:

a concentrator that collects solar heat;

an absorption module comprising an absorber having a cavity to which solar heat collected by the concentrator is transferred, a plurality of absorption heat pipes being radially arranged and absorbing heat of the absorber and having a bent pipe shape to surround an outer peripheral surface of the absorber in a longitudinal direction, and a casing formed to surround the absorption heat pipes;

an alkali metal thermal to electric converter (AMTEC) that generates electricity by receiving heat absorbed by the absorption module; and a heat pipe comprising a heating end having a cylindrical shape, a front side of which is open so that the heating end is mounted on an outer peripheral surface of the casing, and a cooling end that protrudes and extends from the heating end, is inserted into the AMTEC and is cooled.

17. A solar power generation system comprising:

a concentrator that collects solar heat;

an absorption module comprising an absorber having a cavity to which solar heat collected by the concentrator is transferred, and an absorption heat pipe having a cylindrical shape, a front side of which is open so that the absorption heat pipe is mounted on an outer peripheral surface of the absorber;

an alkali metal thermal to electric converter (AMTEC) that generates electricity by receiving heat absorbed by the absorption module; and a heat pipe comprising a heating end having a cylindrical shape, a front side of which is open so that the heating end is mounted on an outer peripheral surface of the absorption heat pipe and the heating end being coupled to a rear side of the absorption heat pipe through a block-coupling technique, and a cooling end that protrudes and extends from the heating end, is inserted into the AMTEC and is cooled.

* * * * *